US012763749B2

(12) United States Patent
Cheng et al.

(10) Patent No.: US 12,763,749 B2
(45) Date of Patent: Oct. 13, 2026

(54) IN-PHASE NOISE SUPPRESSION DEVICE

(71) Applicant: EMPass Technology Inc., New Taipei City (TW)

(72) Inventors: Chi-Hsuan Cheng, New Taipei City (TW); Yang-Chih Huang, New Taipei City (TW)

(73) Assignee: EMPASS TECHNOLOGY INC., New Taipei City (TW)

( * ) Notice: Subject to any disclaimer, the term of this patent is extended or adjusted under 35 U.S.C. 154(b) by 347 days.

(21) Appl. No.: 18/485,886

(22) Filed: Oct. 12, 2023

(65) Prior Publication Data

US 2024/0128947 A1 Apr. 18, 2024

(30) Foreign Application Priority Data

Oct. 13, 2022 (TW) .................................. 111138846

(51) Int. Cl.

| | |
|---|---|
| ***H03H 7/42*** | (2006.01) |
| ***H03H 1/00*** | (2006.01) |
| ***H03H 7/01*** | (2006.01) |

(52) U.S. Cl.

CPC .......... *H03H 7/427* (2013.01); *H03H 1/0007* (2013.01); *H03H 7/0115* (2013.01)

(58) Field of Classification Search

CPC ..... H03H 7/0115; H03H 1/0007; H03H 7/427
USPC ................................ 333/4, 5, 175, 181, 185
See application file for complete search history.

(56) References Cited

U.S. PATENT DOCUMENTS

| | | | | |
|---|---|---|---|---|
| 10,263,591 | B1 * | 4/2019 | Kraz | H03H 7/0115 |
| 10,355,669 | B2 | 7/2019 | Wang et al. | |
| 2012/0025925 | A1 | 2/2012 | Wu et al. | |

OTHER PUBLICATIONS

Search Report appended to an Office Action, which was issued to Taiwanese counterpart application No. 111138846 by the TIPO on Aug. 23, 2023, with an English translation thereof, 2 pages.

* cited by examiner

*Primary Examiner* — Rakesh B Patel
(74) *Attorney, Agent, or Firm* — HSML P.C.

(57) ABSTRACT

An in-phase noise suppression device includes a signal transmitting unit and a grounding unit. The signal transmitting unit includes a number (N) of signal transmitting circuits, where N≥3. Each of the signal transmitting circuits has an input terminal and an output terminal, receives a level signal at the input terminal thereof, and outputs the level signal at the output terminal thereof. The grounding unit includes a grounding circuit that is connected to the signal transmitting unit. The level signals respectively received by the signal transmitting circuits at the input terminals thereof, when being respectively transmitted along the signal transmitting circuits, generate at least two balanced digital signals and in-phase noise. The signal transmitting unit and the grounding circuit cooperatively constitute a noise suppression device so as to suppress the in-phase noise generated in the signal transmitting circuits.

11 Claims, 10 Drawing Sheets

IN-PHASE NOISE SUPPRESSION DEVICE

CROSS-REFERENCE TO RELATED APPLICATION

This application claims priority to Taiwanese Patent Application No. 111138846, filed on Oct. 13, 2022.

FIELD

The disclosure relates to a noise suppression circuit, and more particularly to an in-phase noise suppression device.

BACKGROUND

With the progress of advanced devices such as mobile phones, augmented reality/virtual reality (AR/VR) devices or artificial intelligence (AI) servers, ultra high speed digital data transmission becomes the bottleneck for the overall performance of the devices. In the past decades, differential transmission was the mainstream signal transmission technology because of its high immunity to external noise, low interference to adjacent traces or components, and design simplicity for broadband components such as connectors or jumpers. Some of the famous examples are Universal Serial Bus (USB) in personal computers, Peripheral Component Interconnect Express (PCI-E) in servers and Mobile Industry Processor Interface (MIPI) physical layer (e.g., D PHY) in mobile devices. However, recently differential transmission has encountered channel capacity problems. To further enhance channel capacity, adding more paths and boosting the data rate are the two main methods, but both methods introduce new problems. Boosting the data rate will most likely increase the design difficulties for traces, chips and connectors. Adding more paths will occupy more space and increase layout difficulties, especially in some space-sensitive applications such as mobile phones. Therefore, multiwire differential (>2 lines) transmission was introduced to transmit multiple pieces of data simultaneously in a more efficient way. For example, MIPI C-PHY utilizes three lines to transmit three differential signals simultaneously, which is clearly more space efficient and can reduce layout design difficulties when compared to the traditional differential transmission (six lines are required). However, the multiwire differential (>2 lines) transmission will also encounter similar problems as the standard differential transmission, especially in-phase (common mode) noise on all the traces and matching issues for all the data paths. Because of unavoidable undesirable effects, when signals are transmitted through multiple transmission lines formed on a circuit board, in-phase noise would be generated. If the noise is not timely filtered out or suppressed during the transmission, the noise would disturb receivers or components near the transmission lines and affect the signal quality of the transmission, or cause new radiation problems such as electromagnetic interference or radio frequency interference. Conventional non-ferromagnetic noise suppression technology such as two-line in phase filter can only suppress noise generated by the transmission of a single piece of data through up to two transmission lines but no more. Besides, for the traditional differential transmission, only one matching issue, that is the matching characteristic of the differential mode of two lines, is under consideration. However, for multiwire differential (>2 lines) transmission, the situation becomes much more complicated. For example, three matching issues, i.e., the matching characteristics between every two traces, are under considerations for MIPI C-PHY (in a three-line transmission). The matching issues for other system may be even more complicated. The matching issues put high thresholds for the design of an N-line in-phase noise suppression device, where N≥3.

SUMMARY

Therefore, an object of the disclosure is to provide an in-phase noise suppression device that can transmit at least two pieces of digital data simultaneously with good signal qualities and that can suppress in-phase noise generated during the transmission.

According to the disclosure, the in-phase noise suppression device includes a signal transmitting unit and a grounding unit. The signal transmitting unit includes a number (N) of signal transmitting circuits, where N≥3. Each of the signal transmitting circuits has an input terminal and an output terminal, receives a level signal at the input terminal thereof, and outputs the level signal at the output terminal thereof. The signal transmitting circuits cooperatively constitute at least two signal transmitting circuit sets. Each of the signal transmitting circuit sets includes at least two of the signal transmitting circuits, and forms a signal transmitting channel for transmitting a balanced digital signal. The grounding unit includes a grounding circuit that is connected to the signal transmitting unit. The level signals respectively received by the signal transmitting circuits at the input terminals thereof, when being respectively transmitted along the signal transmitting circuits, generate at least two balanced digital signals and in-phase noise. The signal transmitting unit and the grounding circuit cooperatively constitute a noise suppression device so as to suppress the in-phase noise generated in the signal transmitting circuits.

BRIEF DESCRIPTION OF THE DRAWINGS

Other features and advantages of the disclosure will become apparent in the following detailed description of the embodiment(s) with reference to the accompanying drawings. It is noted that various features may not be drawn to scale.

DETAILED DESCRIPTION

Figure 1:
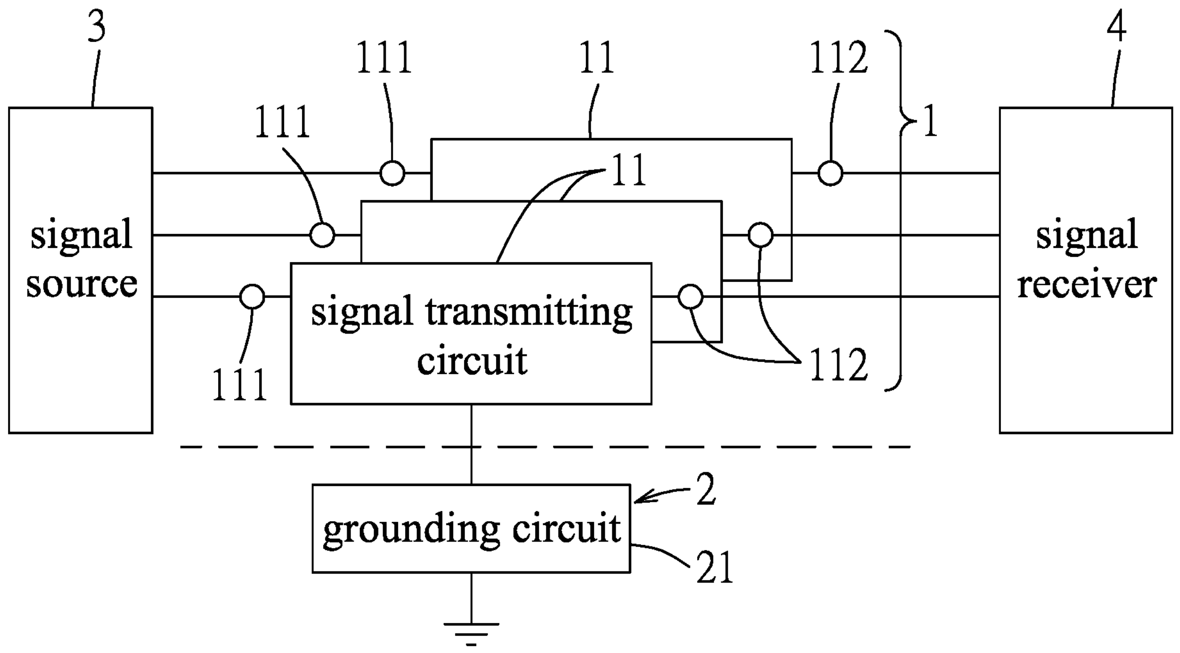
FIG. 1 is a block diagram illustrating an embodiment of an in-phase noise suppression device according to the disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

Referring to FIG. 1, an embodiment of an in-phase noise suppression device according to the disclosure includes a signal transmitting unit 1 and a grounding unit 2. The signal transmitting unit 1 includes a number (N) of signal transmitting circuits 11, where N≥3. For illustration purposes, the signal transmitting unit 1 includes three signal transmitting circuits 11 (i.e., N=3) in this embodiment. Each of the signal transmitting circuits 11 has an input terminal 111 and an output terminal 112, receives a level signal at the input terminal 111 thereof, and outputs the level signal at the output terminal 112 thereof. Each of the signal transmitting circuits 11 offers a signal path to transmit the level signal through the in-phase noise suppression device with or without certain frequency selecting abilities. Each of the signal transmitting circuits 11 may include (but is not limited to) transmission line(s) and/or circuit component(s) (resistor, capacitor, inductor, or combinations thereof). The signal transmitting circuits 11 cooperatively constitute at least two signal transmitting circuit sets. Each of the signal transmitting circuit sets includes at least two of the signal transmitting circuits 11, forms a signal transmitting channel for transmitting a balanced digital signal, and should meet the signal quality specifications to guarantee its usability. For example, each two signal transmitting circuits 11 constitute a signal transmitting circuit set and transmit a differential digital signal, and there are three signal transmitting circuit sets in the signal transmitting unit 1. The level signals respectively received by the signal transmitting circuits 11 at the input terminals 111 thereof are generated by a signal source 3 connected to the input terminals 111 of the signal transmitting circuits 11. The signal source 3 converts at least two pieces of digital data (e.g., three pieces of digital data) to be transmitted into level signals that have signal levels (e.g., voltage levels) dependent on the digital data, and outputs the level signals respectively to the input terminals 111 of the signal transmitting circuits 11.

Therefore, in the case where there are a number (N) of signal transmitting circuits 11, the signal source 3 can transmit at least two pieces of digital data through the signal transmitting circuits 11 to a signal receiver 4 connected to the output terminals 112 of the signal transmitting circuits 11. That is, the signal source 3 converts the digital data to be transmitted into a number (N) of level signals, and outputs the level signals respectively to the input terminals 111 of the signal transmitting circuits 11; and the signal receiver 4 receives the level signals respectively from the output terminals 112 of the signal transmitting circuits 11, and converts the level signals back to digital data, thereby achieving data transmission. In normal condition, the net return current of the level signals produced by the signal source 3 is zero. The level signals represent at least two pieces of digital data. If there is a non-zero net return current, the net return current is viewed as in-phase noise.

The grounding unit 2 includes a grounding circuit 21 that is connected to the signal transmitting unit 1 and a reference node (usually called RF ground or ground) at which a reference voltage is provided. The grounding circuit 21 is a simple passive trace and does not connect to any active signal output. The level signals respectively received by the signal transmitting circuits 11 at the input terminals 111 thereof, when being respectively transmitted along the signal transmitting circuits 11, generate not only at least two balanced digital signals but also in-phase noise. Each of the balanced digital signals has a zero net return current in a certain transmission direction. The net return current is a sum of the currents that are on the structure of the in-phase noise suppression device other than the signal transmitting circuit set transmitting the balanced digital signal and that have different directions compared to the signal direction of the signal transmitting circuit set transmitting the balanced digital signal. During the transmission, the in-phase noise would generate radiation, thereby disturbing circuits or electronic components near the signal transmitting circuits 11. In this embodiment, the signal transmitting unit 1 and the grounding circuit 21 cooperatively constitute a noise suppression device so as to suppress the in-phase noise generated in the signal transmitting circuits 11.

Figure 2:
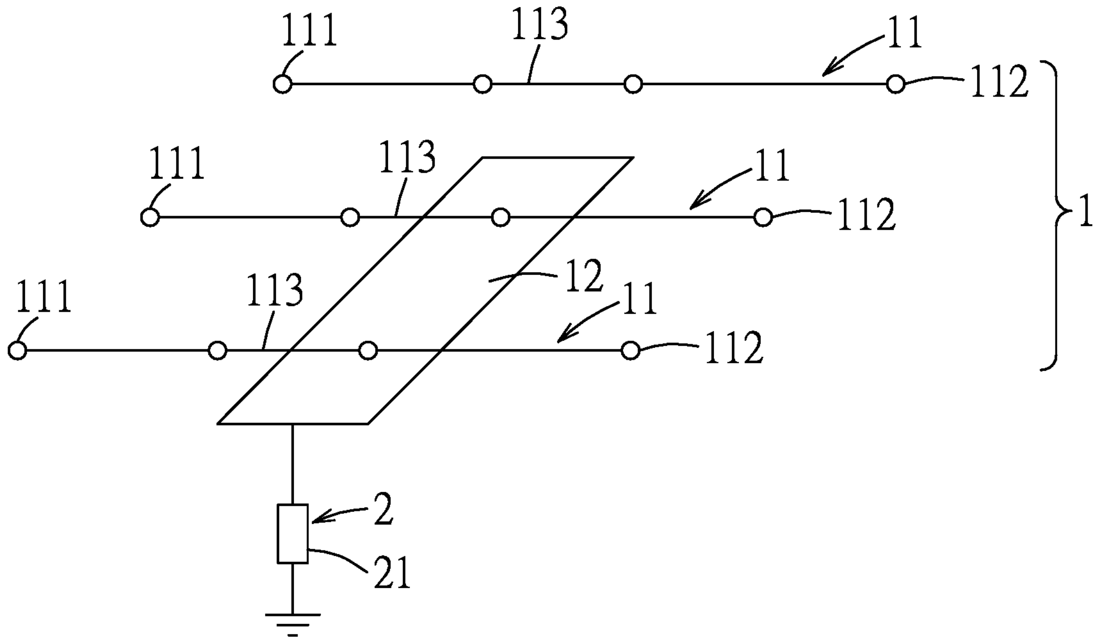
FIG. 2 is a schematic diagram illustrating an implementation of the embodiment.

FIG. 2 illustrates an implementation of this embodiment. Referring to FIG. 2, in the implementation, each of the signal transmitting circuits 11 includes a signal transmitting conductor 113 that is connected to the input and output terminals 111, 112 of the signal transmitting circuit 11. The signal transmitting unit 1 further includes a reference conductor 12 that is electromagnetically coupled to the signal transmitting conductors 113 of the signal transmitting circuits 11 and that is connected to the grounding circuit 21. In addition, with respect to each of the signal transmitting circuit sets, the net coupling between the reference conductor 12 and the transmitting conductors 113 of the signal transmitting circuits 11 of the signal transmitting circuit set is substantially zero (i.e., being zero or small enough). The net coupling is defined as the total coupling level from the reference conductor 12 and the transmitting conductors 113 considering the polarization of the level signals for the transmitting circuits 11 depending on the type of the corresponding balanced digital signal. For example, for C-PHY transmission, there are three signal transmitting circuits 11 cooperatively constituting three signal transmitting circuit sets, and each of the signal transmitting circuit sets includes two of the signal transmitting circuits 11. Each of the signal transmitting circuit sets transmits a differential digital signal, and therefore the polarizations of the level signals for the signal transmitting circuit set are opposite to each other and the net coupling between the reference conductor 12 and the signal transmitting conductors 113 of the signal transmitting circuits 11 of the signal transmitting circuit set is the subtraction of the coupling between the signal transmitting conductor 113 of one of the signal transmitting circuits 11 and the reference conductor 12 from the coupling between the signal transmitting conductor 113 of the other one of the signal transmitting circuits 11 and reference conductor 12. Therefore, the balanced digital signals will pass the in-phase noise suppression device, and the in-phase noise generated in the signal transmitting conductors 113 will be coupled to the reference conductor 12, and will then be grounded by the grounding circuit 21, thereby suppressing the in-phase noise.

Figure 3:
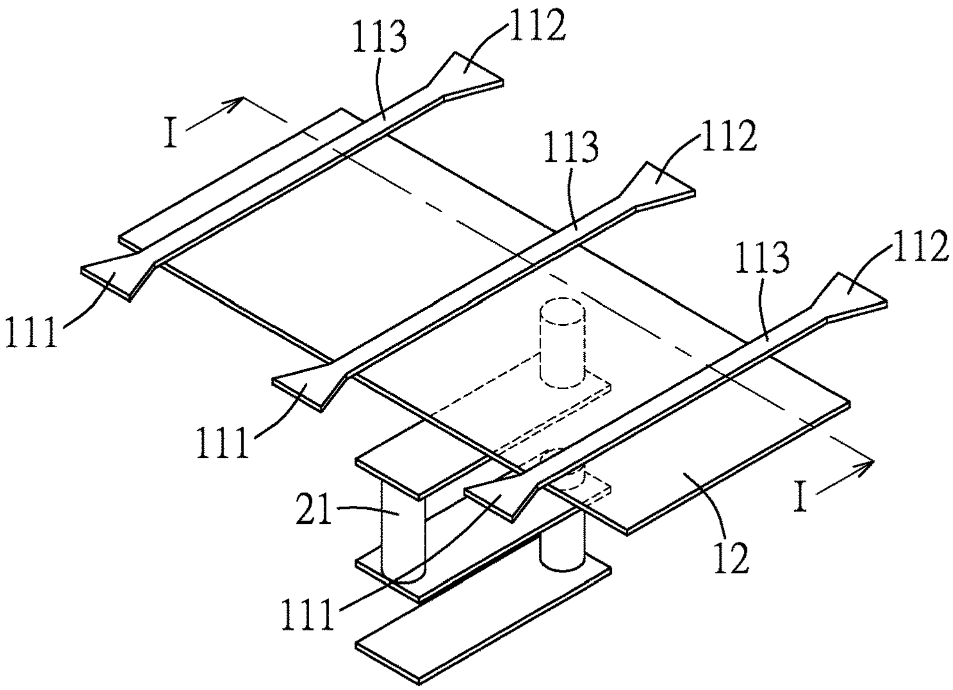
FIG. 3 is a perspective view of a first exemplary structure of the implementation.

FIG. 3 illustrates a perspective view of a first exemplary structure of the implementation shown in FIG. 2. Referring to FIGS. 2 and 3, in the first exemplary structure, the signal transmitting unit 1 and the grounding circuit 21 are laid out in a circuit board. Each of the signal transmitting conductors 113 includes a conductive wire that has an inductive effect. Each of the signal transmitting conductors 113 and the reference conductor 12 create a capacitive effect therebetween. The grounding circuit 21 includes a conductive wire that extends through layers of the circuit board and that has an inductive effect. Depending on where the reference conductor 12 is arranged, the first exemplary structure is equivalent to a circuit having a signal low-pass and noise band-stop response as shown in any one of FIGS. 4, 5 and 6.

Figure 4:
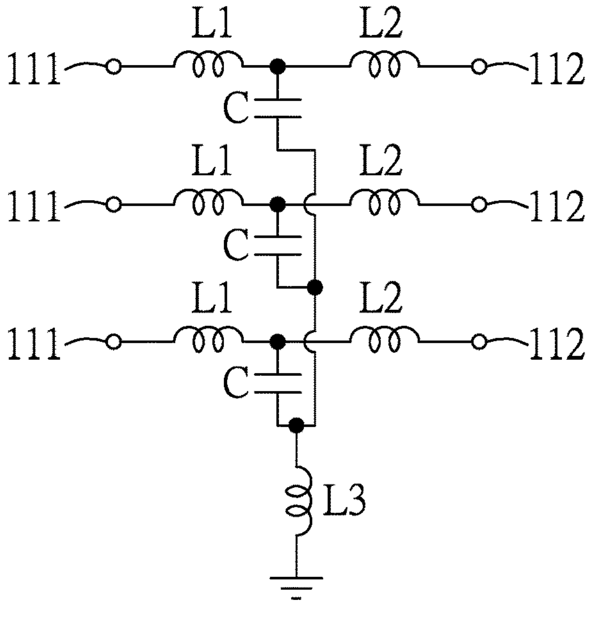
FIG. 4 is a circuit diagram illustrating a first equivalent circuit of the first exemplary structure.

Referring to FIGS. 2, 3 and 4, when the reference conductor 12 is laid close to middle portions of the signal transmitting conductors 113, with respect to each of the signal transmitting circuits 11, the signal transmitting conductor 113 of the signal transmitting circuit 11 is equivalent to a combination of two inductors (L1, L2) that are connected in series between the input terminal 111 of the signal transmitting circuit 11 and the output terminal 112 of the signal transmitting circuit 11, a combination of the signal transmitting conductor 113 of the signal transmitting circuit 11 and the reference conductor 12 is equivalent to a capacitor (C) that is connected to a common node of the inductors (L1, L2) of the signal transmitting circuit 11; and the grounding circuit 21 is equivalent to an inductor (L3).

Figure 5:
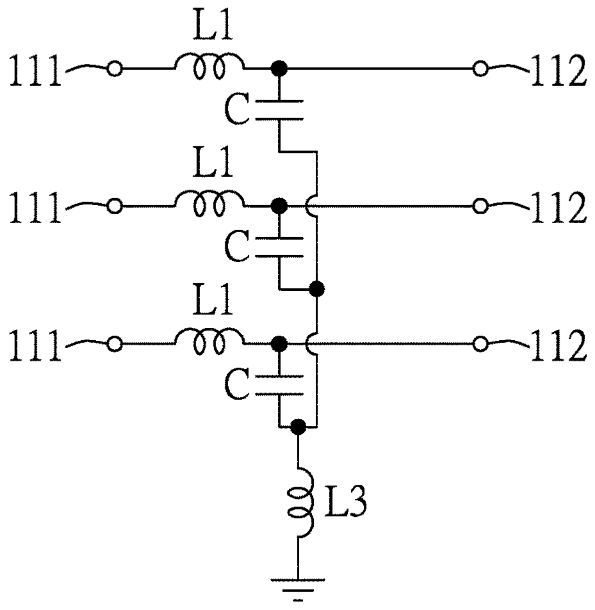
FIG. 5 is a circuit diagram illustrating a second equivalent circuit of the first exemplary structure.

Referring to FIGS. 2, 3 and 5, when the reference conductor 12 is laid close to the output terminals 112 of the signal transmitting circuits 11, with respect to each of the signal transmitting circuits 11, the signal transmitting conductor 113 of the signal transmitting circuit 11 is equivalent to an inductor (L1) that is connected between the input terminal 111 of the signal transmitting circuit 11 and the output terminal 112 of the signal transmitting circuit 11, a combination of the signal transmitting conductor 113 of the signal transmitting circuit 11 and the reference conductor 12 is equivalent to a capacitor (C) that is connected to the output terminal 112 of the signal transmitting circuit 11; and the grounding circuit 21 is equivalent to an inductor (L3).

Figure 6:
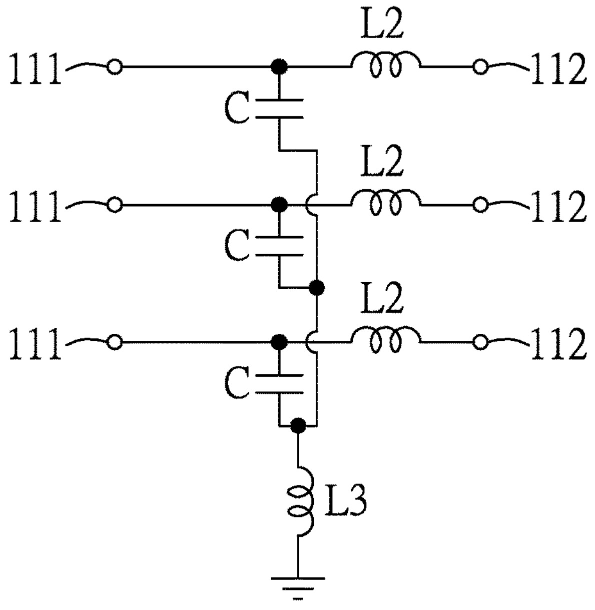
FIG. 6 is a circuit diagram illustrating a third equivalent circuit of the first exemplary structure.

Referring to FIGS. 2, 3 and 6, when the reference conductor 12 is laid close to the input terminals 111 of the signal transmitting circuits 11, with respect to each of the signal transmitting circuits 11, the signal transmitting conductor 113 of the signal transmitting circuit 11 is equivalent to an inductor (L2) that is connected between the input terminal 111 of the signal transmitting circuit 11 and the output terminal 112 of the signal transmitting circuit 11, a combination of the signal transmitting conductor 113 of the signal transmitting circuit 11 and the reference conductor 12 is equivalent to a capacitor (C) that is connected to the input terminal 111 of the signal transmitting circuit 11; and the grounding circuit 21 is equivalent to an inductor (L3).

When the level signals enter the in-phase noise suppression device having an equivalent circuit as shown in any one of FIGS. 4, 5 and 6, the in-phase noise generated in the signal transmitting conductors 113, because of its in-phase characteristic, will be coupled to the grounding circuit 21 by the equivalent capacitors (C) that are constituted from the signal transmitting conductors 113 and the reference conductor 12 and then grounded by the equivalent inductor (L3) of the grounding circuit 21, and will not be transmitted to the output terminals 112. On the contrary, the balanced digital signals generated in the signal transmitting conductors 113 create a zero net current in the equivalent inductor (L3) of the grounding circuit 21, so they will not be affected by the grounding circuit 21 and will be transmitted to the output terminals 112. In addition, the inductors (L1-L3) and the capacitors (C) are able to resonate to attenuate the in-phase noise.

Figure 7:
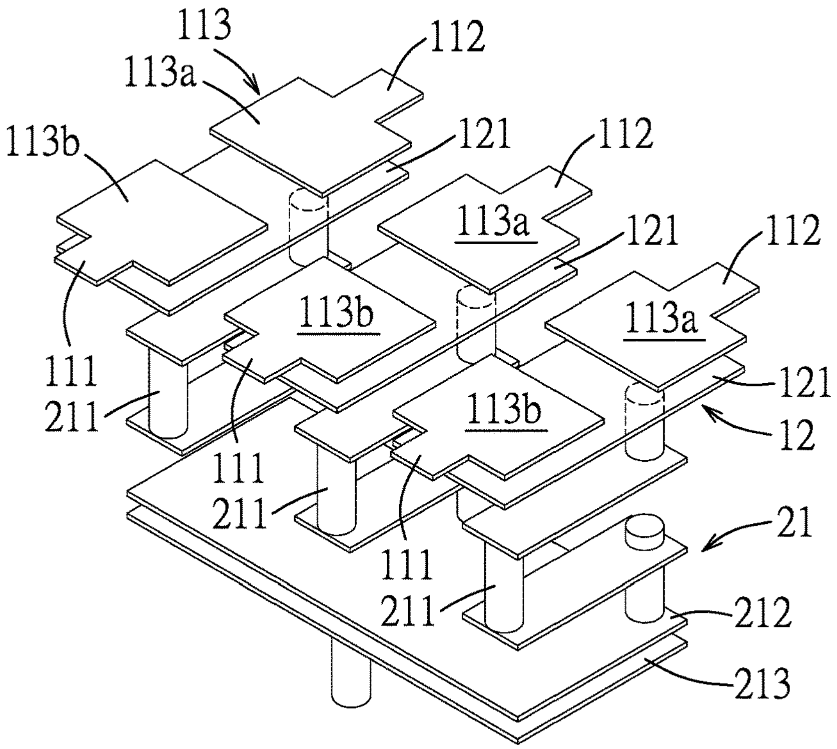
FIG. 7 is a perspective view of a second exemplary structure of the implementation.

FIG. 7 illustrates a perspective view of a second exemplary structure of the implementation shown in FIG. 2. Referring to FIGS. 2 and 7, in the second exemplary structure, the signal transmitting unit 1 and the grounding circuit 21 are laid out in a circuit board. With respect to each of the signal transmitting circuits 11, the signal transmitting conductor 113 of the signal transmitting circuit 11 includes two conductor portions (113*a*, 113*b*), the conductor portion (113*b*) is connected to the input terminal 111 of the signal transmitting circuit 11, the conductor portion (113*a*) is connected to the output terminal 112 of the signal transmitting circuit 11, and the conductor portions (113*a*, 113*b*) are spaced apart from but close to each other and transmit the level signal entering the input terminal 111 of the signal transmitting circuit 11 to the output terminal 112 of the signal transmitting circuit 11 by electromagnetic coupling. The reference conductor 12 includes a number (N) of conductor portions 121 that are spaced apart from each other. Each of the conductor portions 121 corresponds to the conductor portions (113*a*, 113*b*) of a respective one of the signal transmitting conductors 113 in position. The conductor portions (113*a*, 113*b*, 121) may be disposed on the same layer or different layers in the circuit board. In addition, in some cases external elements (e.g., surface-mount-device (SMD) capacitors) can be put among the conductor portions (113*a*, 113*b*, 121) to enhance the electromagnetic coupling if needed. The grounding circuit 21 includes a number (N) of grounding conductive wires 211, a first metal plate 212 and a second metal plate 213. The first and second metal plates 212, 213 are spaced apart from each other, and correspond to each other in position. Each of the grounding conductive wires 211 is connected between a respective one of the conductor portions 121 and the first metal plate 212. The second metal plate 213 is connected to ground.

Figure 8:
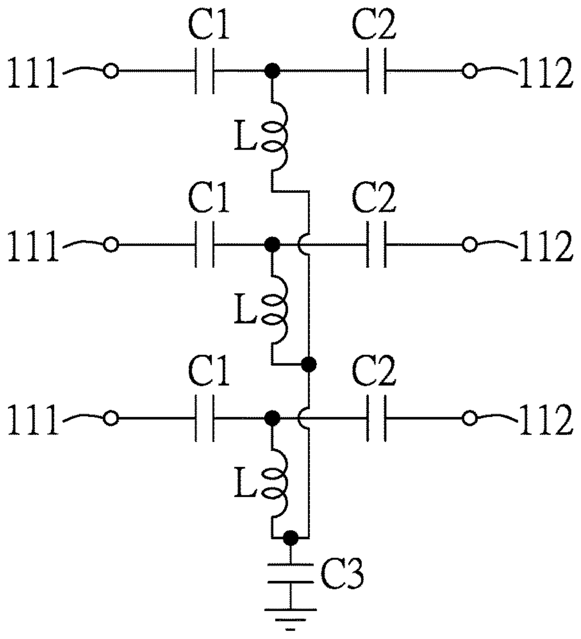
FIG. 8 is a circuit diagram illustrating an equivalent circuit of the second exemplary structure.

The second exemplary structure is equivalent to a circuit having a signal high-pass and noise band-stop response as shown in FIG. 8. Referring to FIGS. 7 and 8, a combination of the conductor portion (113*b*) of each of the signal transmitting conductors 113 and the conductor portion 121 corresponding to the conductor portion (113*b*) in position is equivalent to a capacitor (C1). A combination of the conductor portion (113*a*) of each of the signal transmitting conductors 113 and the conductor portion 121 corresponding to the conductor portion (113*a*) in position is equivalent to a capacitor (C2). A combination of each of the conductor portions 121 and the grounding conductive wire 211 connected to the conductor portion 121 is equivalent to an inductor (L). A combination of the first and second metal plates 212, 213 is equivalent to a capacitor (C3).

In a modification of the second exemplary structure shown in FIG. 7, the conductor portions (113*b*) of the signal transmitting conductors 113 are omitted, and the input terminals 111 are respectively connected to the conductor portions 121. Therefore, an equivalent circuit of the modification includes the equivalent capacitors (C2) that are constituted from the conductor portions (113*a*) of the signal transmitting conductors 113 and the conductor portions 121, and does not include the equivalent capacitors (01) that are constituted from the conductor portions (113*b*) and the conductor portions 121. In another modification of the second exemplary structure shown in FIG. 7, the conductor portions (113*a*) are omitted, and the output terminals 112 are respectively connected to the conductor portions 121. Therefore, an equivalent circuit of the another modification includes the equivalent capacitors (C1) that are constituted from the conductor portions (113*b*) and the conductor portions 121, and does not include the equivalent capacitors (C2) that are constituted from the conductor portions (113*a*) and the conductor portions 121.

When the level signals enter the in-phase noise suppression device having an equivalent circuit as shown in FIG. 8, the in-phase noise generated in the signal transmitting conductors 113, because of its in-phase characteristic, will be grounded by the equivalent inductors (L) that are constituted from the conductor portions 121 and the grounding conductive wires 211 and the equivalent capacitor (C3) that is constituted from the first and second metal plates 212, 213, and will not be transmitted to the output terminals 112. On the contrary, the balanced digital signals generated in the signal transmission conductors 113 create a zero net current in the equivalent inductors (L) that are constituted from the conductor portions 121 and the grounding conductive wires 211, so they will not be affected by the grounding circuit 21 and will be transmitted to the output terminals 112. In addition, the capacitors (C1-C3) and the inductors (L) are able to resonate to attenuate the in-phase noise.

Figure 9:
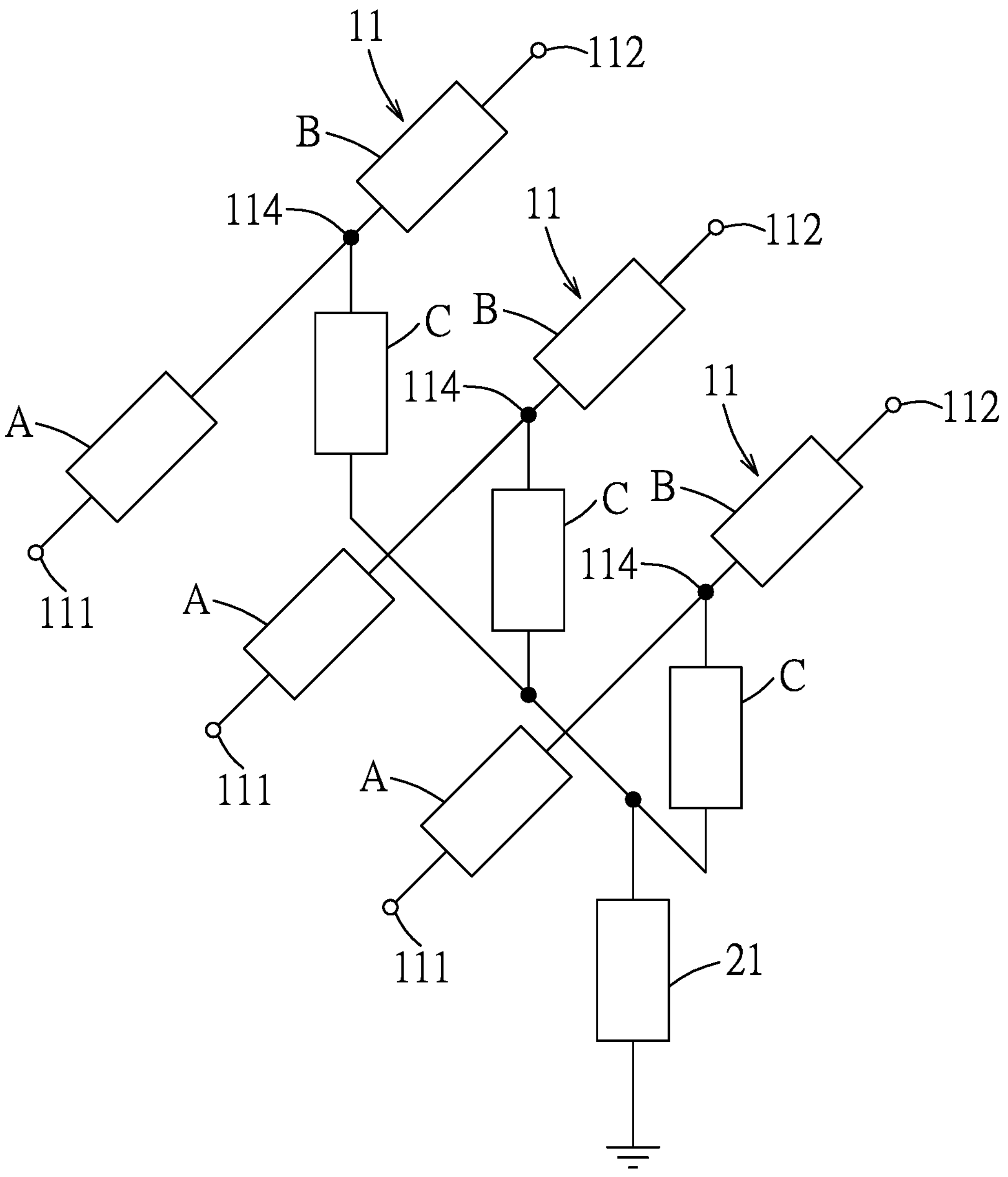
FIG. 9 is a block diagram illustrating a first implementation of multiple signal transmitting circuits of the embodiment.

By properly designing the routing or layout of each of the signal transmitting conductors 113, the reference conductor 12 and the grounding circuit 21 in the circuit board, the signal transmitting conductors 113, the reference conductor 12 and the grounding circuit 21, individually or in combination, will have or will create an inductive effect, a capacitive effect and/or a resistive effect. Therefore, the equivalent circuit of the in-phase noise suppression device of this embodiment is not limited to the circuits shown in FIGS. 4, 5, 6 and 8. Referring to FIG. 9, generally speaking, similar to the circuits shown in FIGS. 4 and 8, each of the signal transmitting circuits 11 includes a first passive element group (A), a second passive element group (B) and a third passive element group (C). The first passive element group (A) is connected to the input terminal 111 of the signal transmitting circuit 11 and an internal node 114 of the signal transmitting circuit 11. The second passive element group (B) is connected to the internal node 114 of the signal transmitting circuit 11 and the output terminal 112 of the signal transmitting circuit 11. The third passive element group (C) is connected to the internal node 114 of the signal transmitting circuit 11 and the grounding circuit 21. Each of the first to third passive element groups (A-C) includes at least one of an inductive element, a capacitive element or a resistive element. With respect to each of the first to third passive element groups (A-C), when the passive element group (A/B/C) includes two or more elements, these elements are connected in series, in parallel, or in series and parallel. In addition, the grounding circuit 21 includes at least one of an inductive element, a capacitive element or a resistive element.

Figure 10:
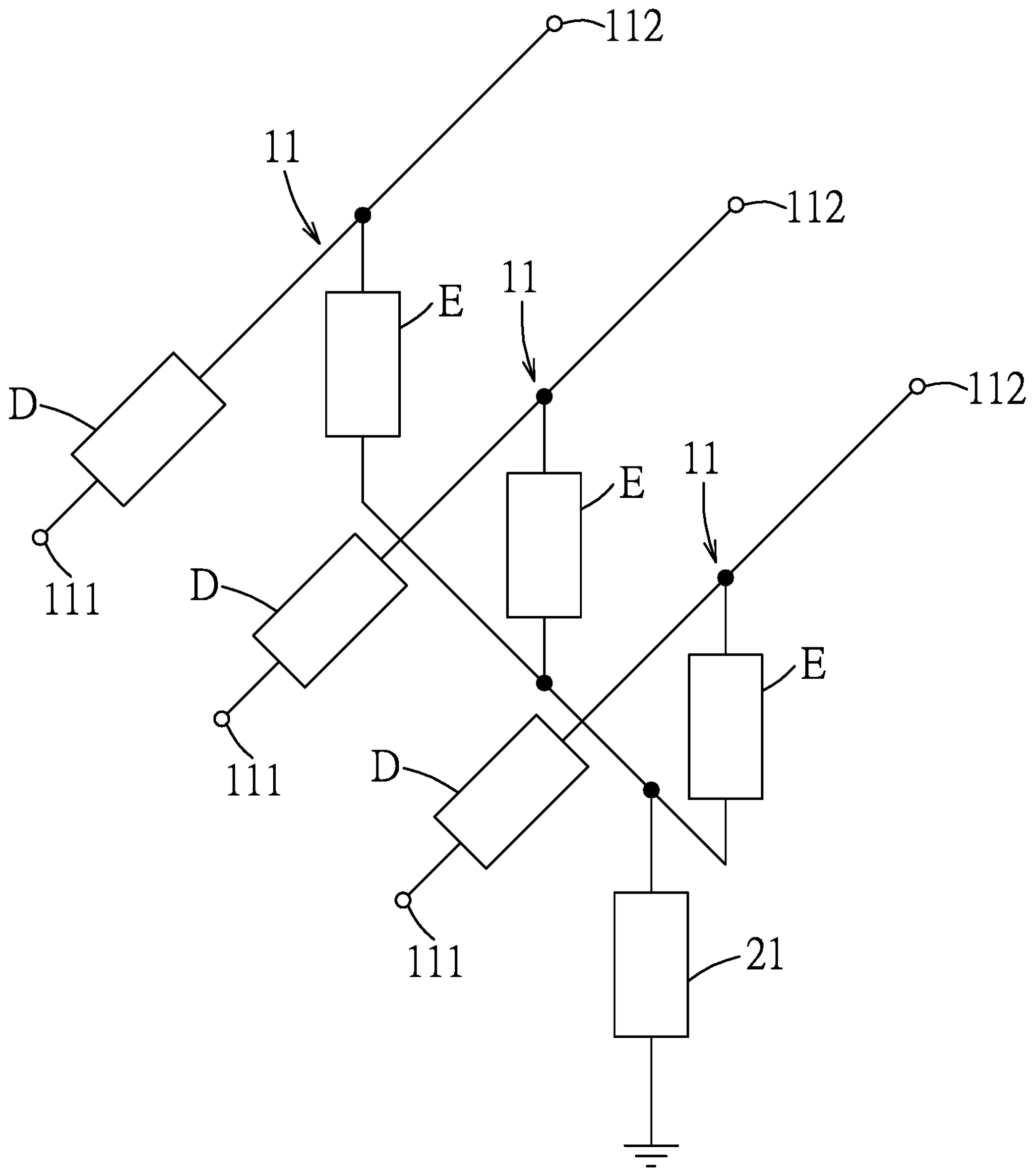
FIG. 10 is a block diagram illustrating. a second implementation of the signal transmitting circuits.
Figure 11:
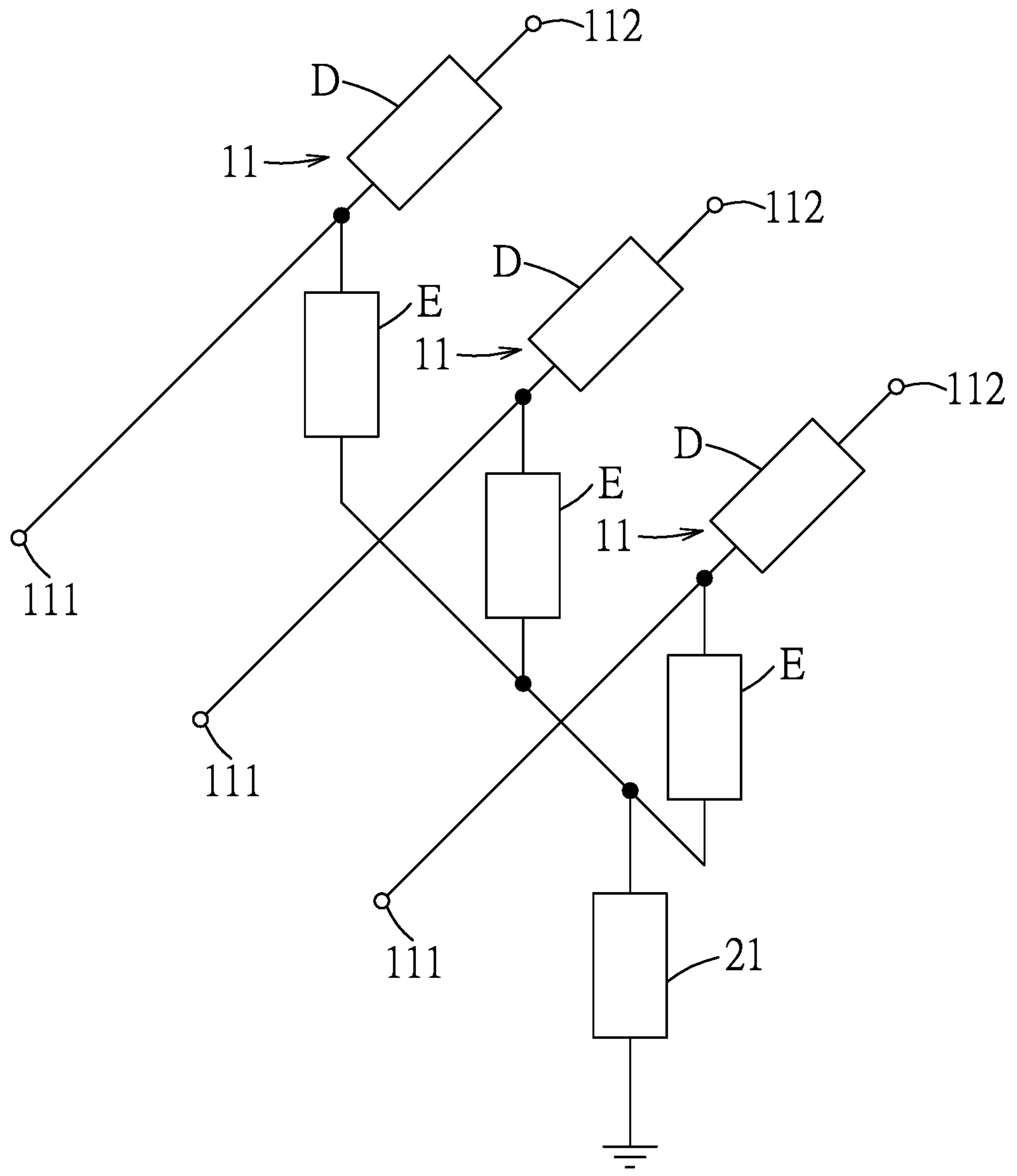
FIG. 11 is a block diagram illustrating a third implementation of the signal transmitting circuits.

Referring to FIGS. 10 and 11, alternatively, similar to the circuits shown in FIGS. 5 and 6, each of the signal transmitting circuits 11 includes a first passive element group (D) and a second passive element group (E). The first passive element group (D) is connected to the input terminal 111 of the signal transmitting circuit 11 and the output terminal 112 of the signal transmitting circuit 11. The second passive element group (B) is connected to the input terminal 111 of the signal transmitting circuit 11 or the output terminal 112 of the signal transmitting circuit 11 and to the grounding circuit 21. Each of the first and second passive element groups (D, E) includes at least one of an inductive element, a capacitive element or a resistive element. With respect to each of the first and second passive element groups (D, E), when the passive element group (D/E) includes two or more elements, these elements are connected in series, in parallel, or in series and parallel.

Referring to FIGS. 2, 9, 10 and 11, therefore, by properly designing the routing or layout of each of the signal transmitting conductors 113, the reference conductor 12 and the grounding circuit 21 in the circuit board, such that the passive element groups ((A-C) or (D, E)) cooperate with the grounding circuit 21 to constitute an in-phase noise suppression device (e.g., a device having a signal low-pass and noise band-stop response, a device having a signal high-pass and noise band-stop response, a device having a signal band-pass and noise band-stop response, a device having a signal all-pass and noise band-stop response, etc.), the in-phase noise suppression device can permit the transmission of the balanced digital signals while suppressing the in-phase noise.

Figure 12:
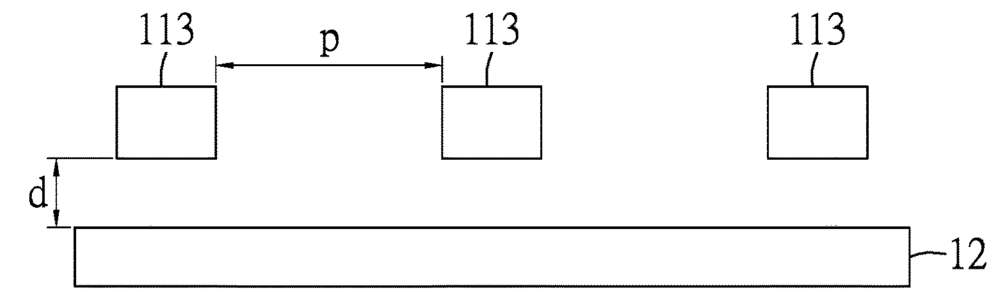
FIG. 12 is a sectional view of the first exemplary structure taken along line I-I in FIG. 3.

FIG. 12 illustrates a sectional view of the first exemplary structure taken along line I-I in FIG. 3. Referring to FIG. 12, in the first exemplary structure, the signal transmitting conductors 113 are coplanar with each other. The reference conductor 12 is disposed on a side of the signal transmitting conductors 113. A first spacing (p) between any two adjacent ones of the signal transmitting conductors 113 is larger than a second spacing (d) between each of the signal transmitting conductors 113 and the reference conductor 12, so as to reduce electromagnetic coupling among the signal transmitting conductors 113, thereby causing the balanced digital signals to be transmitted at similar speeds and similar losses.

Figure 13:
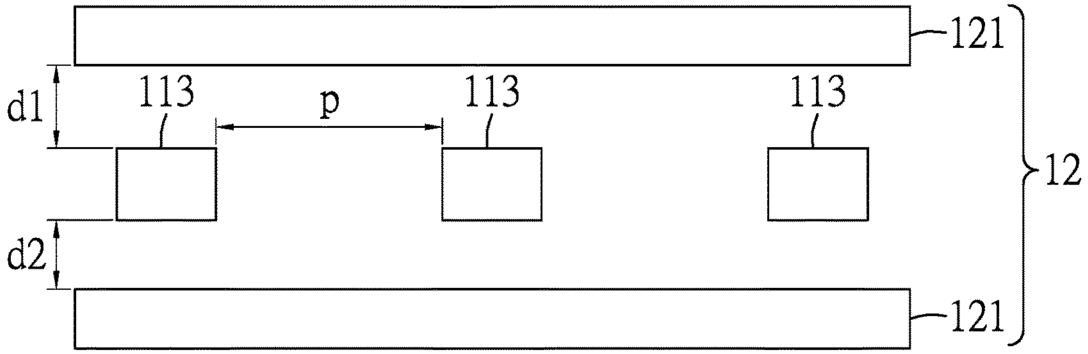
FIG. 13 is a sectional view of a first modification of the first exemplary structure.

FIG. 13 illustrates a sectional view of a first modification of the first exemplary structure shown in FIG. 12. Referring to FIG. 13, in the first modification, the reference conductor 12 includes two conductor portions 121 that are respectively disposed on two opposite sides of the signal transmitting conductors 113. A first spacing (p) between any two adjacent ones of the signal transmitting conductors 113 is larger than a second spacing (d1) between each of the signal transmitting conductors 113 and one of the conductor portions 121 and a second spacing (d2) between each of the signal transmitting conductors 113 and the other one of the conductor portions 121, so as to reduce electromagnetic coupling among the signal transmitting conductors 113, thereby causing the balanced digital signals to be transmitted at similar speeds and similar losses. The second spacings (d1, d2) may be different from each other.

Figure 14:
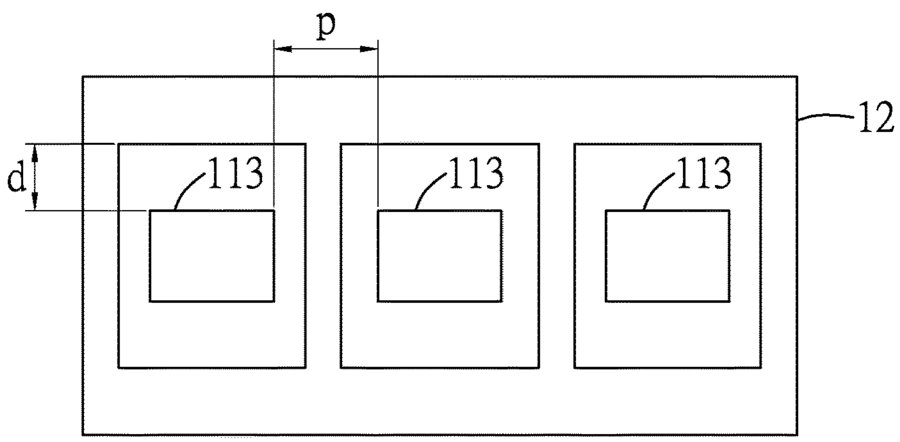
FIG. 14 is a sectional view of a second modification of the first exemplary structure.

FIG. 14 is a sectional view of a second modification of the first exemplary structure shown in FIG. 12. Referring to FIG. 14, in the second modification, the reference conductor 12 forms a shielding structure that surrounds each of the signal transmitting conductors 113, and a first spacing (p) between any two adjacent ones of the signal transmitting conductors 113 is larger than a second spacing (d) between each of the signal transmitting conductors 113 and the reference conductor 12. Therefore, each of the signal transmitting conductors 113 is shielded by the reference conductor 12, so as to reduce electromagnetic coupling among the signal transmitting conductors 113, thereby causing the balanced digital signals to be transmitted at similar speeds and similar losses.

Figure 15:
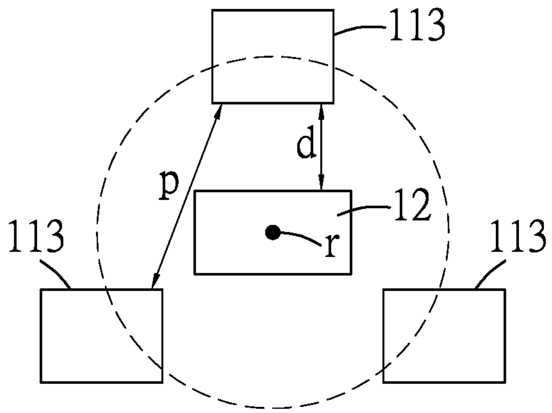
FIG. 15 is a sectional view of a third modification of the first exemplary structure.

FIG. 15 illustrates a sectional view of a third modification of the first exemplary structure shown in FIG. 12. Referring to FIG. 15, in the third modification, the signal transmitting conductors 113 are arranged at angular intervals about a reference node (r). The reference conductor 12 is disposed at the reference node (r). A first spacing (p) between any two adjacent ones of the signal transmitting conductors 113 is larger than a second spacing (d) between each of the signal transmitting conductors 113 and the reference conductor 12, so as to reduce electromagnetic coupling among the signal transmitting conductors 113, thereby causing the balanced digital signals to be transmitted at similar speeds and similar losses. It should be noted that the signal transmitting conductors 113 and the reference conductor 12 may be coplanar with each other in the circuit board, and each of the signal transmitting conductors 113 may extend meanderingly in a direction away from the reference conductor 12.

Figure 16:
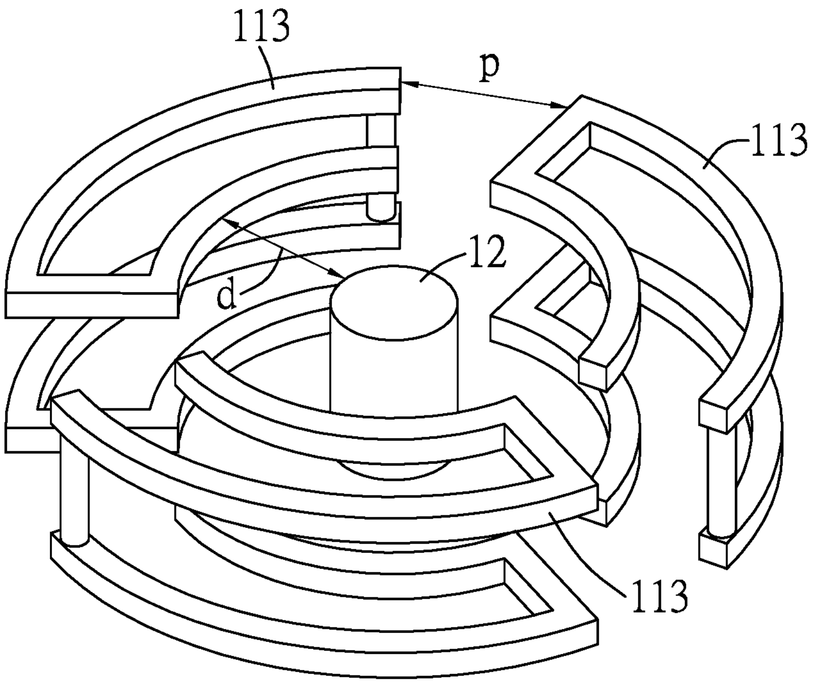
FIG. 16 is a perspective view of a third exemplary structure of the implementation.
Figure 17:
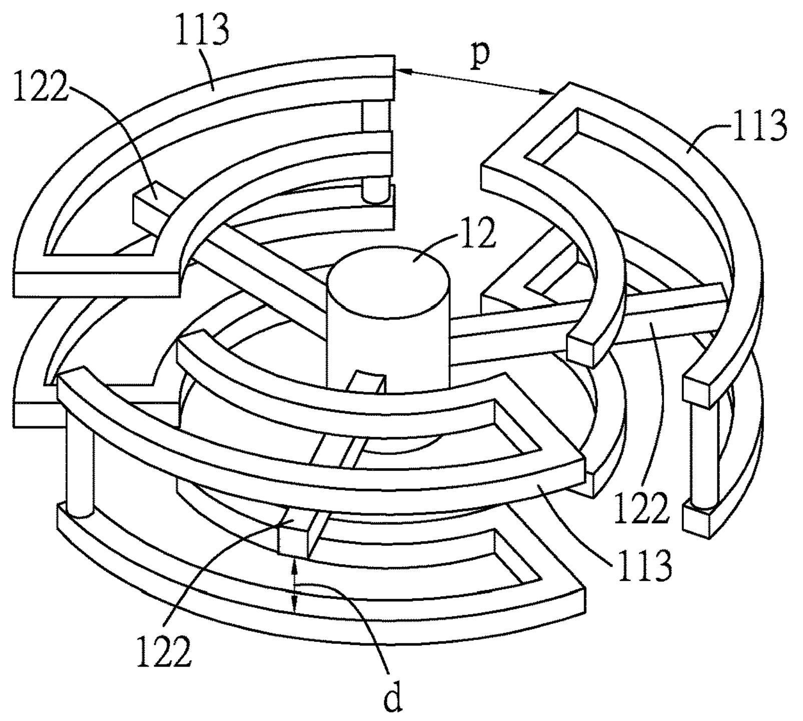
FIG. 17 is a perspective view of a modification of the third exemplary structure.

FIG. 16 illustrates a perspective view of a third exemplary structure of the implementation shown in FIG. 2. Referring to FIG. 16, in the third exemplary structure, each of the signal transmitting conductors 113 extends through layers of a circuit board and meanderingly in each layer. FIG. 17 illustrates a perspective view of a modification of the third exemplary structure shown in FIG. 16. Referring to FIG. 17, in the modification, the reference conductor 12 includes a number (N) of protrusions 122 that respectively protrude toward the signal transmitting conductors 113. In FIGS. 16 and 17, a first spacing (p) between any two adjacent ones of the signal transmitting conductors 113 is larger than a second spacing (d) between each of the signal transmitting conductors 113 and the reference conductor 12.

Figure 18:
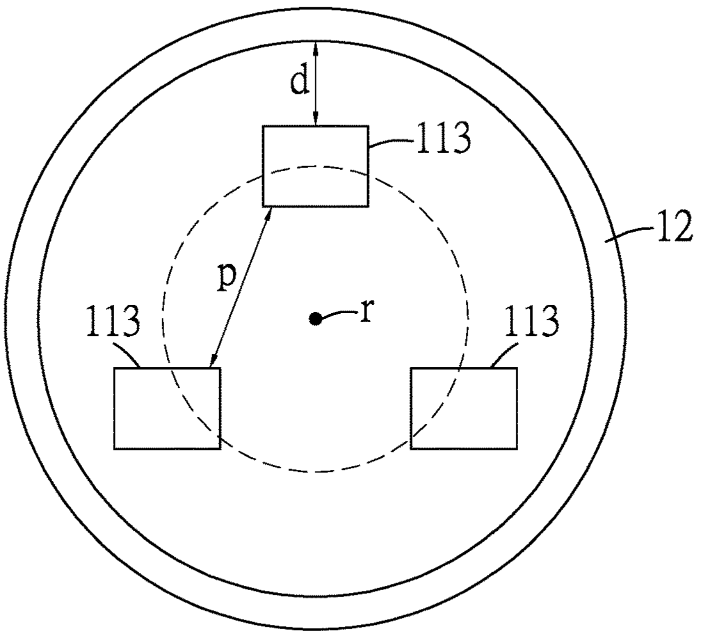
FIG. 18 is a sectional view of a fourth modification of the first exemplary structure.

FIG. 18 illustrates a sectional view of a fourth modification of the first exemplary structure shown in FIG. 12. Referring to FIG. 18, in the fourth modification, the signal transmitting conductors 113 are arranged at angular intervals about a reference node (r). The reference conductor 12 surrounds the signal transmitting conductors 113 about the reference node (r). A first spacing (p) between any two adjacent ones of the signal transmitting conductors 113 is larger than a second spacing (d) between each of the signal transmitting conductors 113 and the reference conductor 12, so as to reduce electromagnetic coupling among the signal transmitting conductors 113, thereby causing the balanced digital signals to be transmitted at similar speeds and similar losses. "The reference conductor 12 surrounds the signal transmitting conductors 113" means that: (a) the reference conductor 12 can have multiple portions, at least one of which is disposed above the transmitting conductors 113, and the other one(s) of which is/are disposed below the transmitting conductors 113, and these portions are connected together in a far distance; or (b) the reference conductor 12 can be circularly adjacent to the signal transmitting conductors 113.

Referring back to FIG. 1, in view of the above, in this embodiment, the signal transmitting circuits 11 can transmit the level signals received at the input terminals 111 thereof to the output terminals 112 thereof. In addition, the signal transmitting unit 1 and the grounding circuit 21 cooperatively constitute a noise suppression device that can attenuate the in-phase noise generated in the signal transmitting circuits 11 and/or introduce the in-phase noise to ground so as to suppress the in-phase noise.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects; such does not mean that every one of these features needs to be practiced with the presence of all the other features. In other words, in any described embodiment, when implementation of one or more features or specific details does not affect implementation of another one or more features or specific details, said one or more features may be singled out and practiced alone without said another one or more features or specific details. It should be further noted that one or more features or specific details from one embodiment may be practiced together with one or more features or specific details from another embodiment, where appropriate, in the practice of the disclosure.

While the disclosure has been described in connection with what is(are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. An in-phase noise suppression device comprising:

a signal transmitting unit including a number (N) of signal transmitting circuits, where N≥3, each of said signal transmitting circuits having an input terminal and an output terminal, receiving a level signal at said input terminal thereof, and outputting the level signal at said output terminal thereof, said signal transmitting circuits cooperatively constituting at least two signal transmitting circuit sets, each of said signal transmitting circuits being assigned to at least one of said signal transmitting circuit sets, each of said signal transmitting circuit sets including at least two of said signal transmitting circuits, and forming a signal transmitting channel for transmitting a balanced digital signal; and a grounding unit including a grounding circuit that is connected to said signal transmitting unit;

wherein the level signals respectively received by said signal transmitting circuits at said input terminals thereof, when being respectively transmitted along said signal transmitting circuits, generate at least two balanced digital signals and in-phase noise;

wherein said signal transmitting unit and said grounding circuit cooperatively constitute a noise suppression device so as to suppress the in-phase noise generated in said signal transmitting circuits;

wherein each of said signal transmitting circuits includes a signal transmitting conductor that is connected to said input and output terminals of said signal transmitting circuit;

wherein said signal transmitting unit further includes a reference conductor that is electromagnetically coupled to said signal transmitting conductors of said signal transmitting circuits and that is connected to said grounding circuit; and wherein, with respect to each of said signal transmitting circuit sets, net coupling between said signal transmitting conductors of said signal transmitting circuits of said signal transmitting circuit set and the reference conductor is substantially zero.

2. The in-phase noise suppression device as claimed in claim 1, wherein said grounding circuit includes at least one of an inductive element, a capacitive element or a resistive element.

3. The in-phase noise suppression device as claimed in claim 1, wherein said reference conductor forms a shielding structure that surrounds each of said signal transmitting conductors so as to reduce electromagnetic coupling among said signal transmitting conductors.

4. The in-phase noise suppression device as claimed in claim 1, wherein:

said signal transmitting conductors are coplanar with each other;

said reference conductor is disposed on a side of said signal transmitting conductors; and a first spacing between any two adjacent ones of said signal transmitting conductors is larger than a second spacing between each of said signal transmitting conductors and said reference conductor, so as to reduce electromagnetic coupling among said signal transmitting conductors.

5. The in-phase noise suppression device as claimed in claim 1, wherein:

said signal transmitting conductors are coplanar with each other;

said reference conductor includes two conductor portions that are respectively disposed on two opposite sides of said signal transmitting conductors; and a first spacing between any two adjacent ones of said signal transmitting conductors is larger than a second spacing between each of said signal transmitting conductors and said reference conductor, so as to reduce electromagnetic coupling among said signal transmitting conductors.

6. The in-phase noise suppression device as claimed in claim 1, wherein said reference conductor includes a number (N) of conductor portions that are spaced apart from each other and that respectively correspond to said signal transmitting conductors in position.

7. The in-phase noise suppression device as claimed in claim 1, wherein:

said signal transmitting conductors are arranged at angular intervals about a reference node; and said reference conductor is disposed at the reference node.

8. The in-phase noise suppression device as claimed in claim 1, wherein:

said signal transmitting conductors are arranged at angular intervals about a reference node; and said reference conductor surrounds said signal transmitting conductors about the reference node.

9. The in-phase noise suppression device as claimed in claim 1, wherein each of said signal transmitting circuits includes:

a first passive element group connected to said input terminal of said signal transmitting circuit and an internal node of said signal transmitting circuit;

a second passive element group connected to said internal node of said signal transmitting circuit and said output terminal of said signal transmitting circuit; and a third passive element group connected to said internal node of said signal transmitting circuit and said grounding circuit;

each of said first to third passive element groups including at least one of an inductive element, a capacitive element or a resistive element.

10. The in-phase noise suppression device as claimed in claim 1, wherein each of said signal transmitting circuits includes:

a first passive element group connected to said input terminal of said signal transmitting circuit and said output terminal of said signal transmitting circuit; and a second passive element group connected to said input terminal of said signal transmitting circuit and said grounding circuit;

each of said first and second passive element groups including at least one of an inductive element, a capacitive element or a resistive element.

11. The in-phase noise suppression device as claimed in claim 1, wherein each of said signal transmitting circuits includes:

a first passive element group connected to said input terminal of said signal transmitting circuit and said output terminal of said signal transmitting circuit; and a second passive element group connected to said output terminal of said signal transmitting circuit and said grounding circuit;

each of said first and second passive element groups including at least one of an inductive element, a capacitive element or a resistive element.

* * * * *